United States Patent [19]

Cuevas

[11] Patent Number: 4,845,381
[45] Date of Patent: Jul. 4, 1989

[54] VOLTAGE LEVEL SHIFTING CIRCUIT

[75] Inventor: Peter Cuevas, San Jose, Calif.

[73] Assignee: VLSI Technology, Inc., San Jose, Calif.

[21] Appl. No.: 103,841

[22] Filed: Oct. 1, 1987

[51] Int. Cl.$^4$ .................. H03K 17/10; H03K 17/16; H03K 17/687; H03K 3/356

[52] U.S. Cl. ........................... 307/264; 307/475; 307/279; 307/290; 307/585; 307/576; 307/579; 307/451; 365/205; 365/226; 365/228

[58] Field of Search ............... 307/451, 475, 279, 290, 307/291, 576, 579, 585, 264, 270; 365/226, 228, 205, 104

[56] References Cited

U.S. PATENT DOCUMENTS

| | | | |
|---|---|---|---|
| 4,476,401 | 10/1984 | Lin | 307/585 X |
| 4,616,148 | 10/1986 | Ochii et al. | 307/279 X |
| 4,656,374 | 4/1987 | Rapp | 307/279 X |
| 4,689,504 | 8/1987 | Raghunathan et al. | 307/585 X |
| 4,695,744 | 9/1987 | Giordano | 307/279 |
| 4,697,108 | 9/1987 | Chappell et al. | 307/585 X |

*Primary Examiner*—John S. Heyman
*Assistant Examiner*—David R. Bertelson
*Attorney, Agent, or Firm*—Limbach, Limbach & Sutton

[57] ABSTRACT

In the present invention, a voltage level shifting circuit is disclosed. The voltage level shifting circuit comprises a first inventer and a second inverter with each inverter having a P-type MOS transistor and an N-type MOS transistor. Each of the inverters has an input port, an output port, a first voltage port and a second voltage port. The source of the P-type MOS transistor or N-type MOS transistor of each inverter is connected to the first voltage port. The voltage level shifting circuit also comprises two MOS transistors of the same conductivity type as the transistors of the inverter whose source is connected to the first voltage port. Each of the MOS transistors has a source, a drain and a gate with the drain connected to the first voltage port of each of the inverters. The sources of the first and second MOS transistors are connected together and to a high voltage level, such as $V_{pp}$. Cross-coupling is provided by connecting the gate of the MOS transistor to the output port of the other inverter. The output is taken from the output port of the second inverter.

27 Claims, 2 Drawing Sheets

VOLTAGE LEVEL SHIFTING CIRCUIT

TECHNICAL FIELD

The present invention relates to a voltage level shifting circuit and, more particularly, to a voltage level shifting for receiving an input signal which varies between a first voltage and a second voltage, and for producing an output signal which varies between the first voltage and a third voltage where the third voltage may be greater or less than the second voltage.

BACKGROUND OF THE INVENTION

Voltage level shifting circuits are well-known in the art. Typically, they are classified either as shift-up or shift-down circuits. They receive an input signal which varies between a first voltage and a second voltage. They produce an output signal which varies between a first voltage and a third voltage. In a shift-up circuit the third voltage of the output signal is greater than the second voltage of the input signal. In a shift-down circuit, the opposite is true.

In many types of digital signal application, it is desired to have a voltage level greater than the common digital signal, which varies between zero volts and 5 volts. For example, to program a EEPROM memory device, it is desired to have a voltage level varying between zero volts and a high voltage level, such as °volts. Thus, voltage level shifting circuits of the shift-up types are required.

Voltage level shifting circuits have been described in the literature. See, for example, U.S. Pat. Nos. 4,132,904; 4,418,293; 4,580,245; 4,375,677; 4,342,101; 4,460,978; 4,131,951; and 4,542,484. Although none of the foregoing references teaches or suggests applicants's invention, the closest reference appears to be U.S. Pat. No. 4,132,904 in FIG. 7 thereof. However, applicant believes that the invention, as set forth herein, has many advantages over the voltage level shifting circuits of the prior art.

SUMMARY OF THE INVENTION

In the present invention, a voltage level shifting circuit is disclosed. The voltage level shifting circuit receives an input signal which varies between a first voltage and a second voltage, and produces an output signal which varies between the first voltage and a third voltage. The shifting circuit comprises a first inverter means which has an input port, an output port, a first voltage port and a second voltage port. The first inverter means also has a plurality of MOS transistors with at least one transistor of a first conductivity type and a least one transistor of a second conductivity type. The transistor of the first conductivity type has a source, a drain and a gate with the source connected to the first voltage port. A first MOS transistor means of the first conductivity type, having a source, a drain and a gate is connected by its drain to the first voltage port of the first inverter means. A second inverter means has an input port, an output port, a first voltage port, and a second voltage port. The second inverter means also has a plurality of MOS transistors with at least one transistor of a first conductivity type and at least one transistor of a second conductivity type. The transistor of the first conductivity type has a source, a drain and a gate with the source connected to the first voltage port. A second MOS transistor means of the first conductivity type, having a source, a drain and a gate, is connected by its drain to the first voltage port of the second inverter means. The source of the first and second MOS transistor means are connected together and to a voltage source for said third voltage. A first coupling means connects the gate of the first MOS transistor means to the output port of the second inverter means. A second coupling means connects the gate of the second MOS transistor means to the output port of the first inverter means.

DETAILED DESCRIPTION OF THE DRAWINGS

Figure 1:
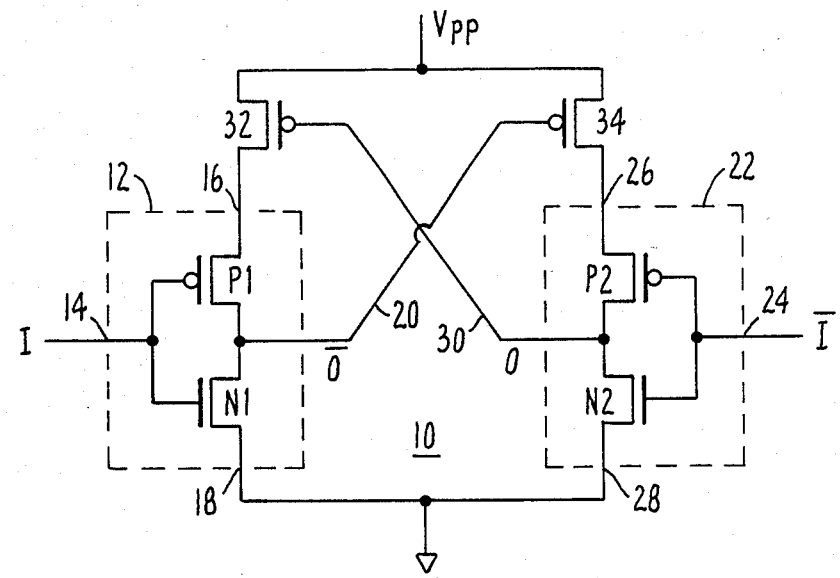
FIG. 1 is a schematic circuit diagram of one embodiment of a shift-up voltage level shifting circuit of the present invention.

Referring to FIG. 1, there is shown a schematic circuit diagram of a shift-up voltage level shifting circuit 10 of the present invention. The circuit 10 comprises a first inverter means 12 having an input port 14, an output port 20, a first voltage port 16, and a second voltage port 18. The input port 14 receives an input signal I, which varies between a first voltage (zero volts, representative of a logic "0") and a second (+5 volts, representative of the logic "1").

The shift-up voltage level shifting circuit 10 also comprises a second inverter means 22, having an input port 24, an output port 30, a first voltage port 26, and a second voltage port 28. The input port 24 receives an inverted input signal, $\bar{I}$, which also varies between the first voltage and the second voltage.

The circuit 10 also comprises a first and a second MOS transistor 32 and 34 of the P conductivity type. Each of the first and second MOS transistor of the P conductivity type 32 and 34 has source, a drain and a gate. The drain of the first MOS transistor 32 is connected to the first voltage port 16 of the first inverter means 12. The drain of the second MOS transistor 34 is connected to the first voltage port 26 of the second inverter means 22. The source of the first and second MOS transistor 32 and 34 are connected together and are connected to $V_{pp}$, a source for the third voltage. For a shift-up circuit, $V_{pp}$ is typically at 20 volts.

The gate of the first MOS transistor 32 is connected to the output port 30 of the second inverter means 22. The gate of the second MOS transistor 34 is connected to the output port 20 of the first inverter means 12. The second voltage port 18 and 28 of the first and second inverter means 12 and 22, respectively, are connected together and are connected to a first voltage source (ground or zero volts).

As shown in FIG. 1, each of the first and second inverter means 12 and 22 are functionally identical and comprises a MOS transistor of the P conductivity type (designated as P1 and P2, respectively), and a MOS transistor of the N conductivity type (designated as N1 and N2, respectively). The gate of the N conductivity type transistor N1 or N2 is connected to the gate of the P conductivity type transistor P1 or P2 respectively, and is connected to the input port 14 or 24, respectively. The drain of the P conductivity type MOS transistor P1 or P2 is connected to the drain of the N conductivity type MOS transistor N1 or N2, respectively, and to the output port 20 or 30, respectively. The P conductivity type MOS transistor P1 or P2 has a source, a drain and a gate with the source connected to the first voltage port 16 or 26, respectively. The N conductivity type MOS transistor N1 or N2 also has a source, a drain and a gate with the source connected to the second voltage port 18 or 28, respectively.

The output of the voltage level shifting circuit 10 is taken from the output port 30 of the second inverter means 22.

In the operation of the circuit 10 of the present invention, an input signal varying between zero volts and +5 volts is received at the input port 14 of the first inverter means 12. An inverse input signal, $\bar{I}$, is received at the input port 24 of the second inverter means 22. If the input signal I is at +5 volts, $\bar{I}$, will be at 0 volts. Transistor N1 will be turned on. The output port 20 of the first inverter means 12 would then drop to ground potential. Transistor N2 will be turned off. This prevents the output port 30 of the second inverter means 22 from reaching ground potential. With the gate of the transistor 34 and the gate of transistor P2 both connected to ground potential, both of those transistors will be turned on which will bring the output port 30 of the second inverter means 22 to the third voltage potential, $V_{pp}$.

When the output port 30 of the second inverter means 22 reaches $V_{pp}$, transistor 32 would then be turned off. This would disconnect the first voltage port 16 from $V_{pp}$. Prior to output port 30 reaching $V_{pp}$, transistor 32 is on, bringing the first voltage port 16 above ground. Transistor P1 is on only as long as the voltage $V_{sg}$ applied to it exceeds its threshold voltage $V_T$. $V_{sg}$ is the voltage differential between the source and the gate; i.e., the voltage at the first voltage port 16 and the voltage at input port 14. Since I is at +5 volts, when the voltage at the first voltage port 16 reaches $5 + V_T$, $V_{sg}$ would then equal $V_T$. When $V_{sg} < V_T$, transistor P1 would then be turned off.

When the input signal I is at 0 volt, the analysis would proceed in the same manner as before since the circuit has left-right symmetry. The output signal taken from the output port 30 of the second inverter means 22 would then be at zero volts.

The limitation of the circuit 10 is that so long as $V_{pp}$ minus (second voltage of input signal + $V_T$ of transistor P1) < the gated − diode breakdown voltage (GDBV-P) for transistor P1, then the circuit 10 would function properly, i.e.

$V_{pp} - (\text{2nd V} + V_T \text{ of P1}) < \text{GDBV-P}$

Hence, the proper operation of the circuit is limited not by GDBV-P, but by a voltage that is significantly higher. In the case where the second voltage of the input signal is at +5 volts, and for a 1.5 to 2 micron process, GDBV-P is approximately 15 volts, $V_{pp}$ can be more than +20 volts. It can be seen that, by this limitation, the input signal does not have to vary between 0 volts and +5 volts. The second voltage can be less than +5 volts so long as the second voltage is high enough to turn on transistor N1 to bring the output port 20 to ground voltage and so long as the relationship between $V_{pp}$, second voltage, $V_T$ and GDBV-P is satisfied.

Figure 2:
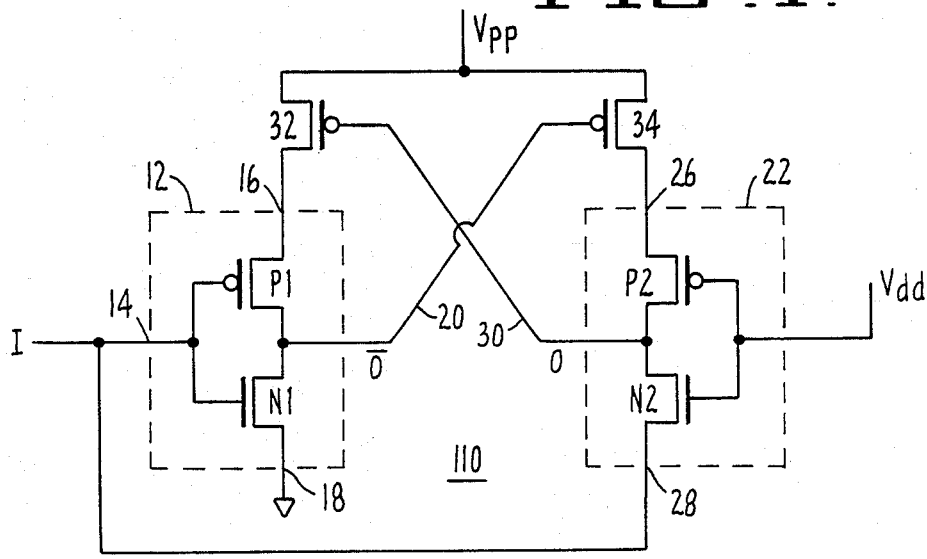
FIG. 2 is a schematic circuit diagram of another embodiment of a shift-up voltage level shifting circuit of the present invention.

Referring to FIG. 2, there is shown another embodiment of a shift-up voltage level shifting circuit 110 of the present invention. The voltage level shifting circuit 110 comprises a first inverter means 12 having a first voltage port 16, a second voltage port 18, an output port 20, and an input port 14. The voltage level shifting circuit 110 also comprises a second inverter means 22 having a first voltage port 26, a second voltage port 28, an output port 30 and an input port 24. The voltage level shifting circuit 110 also comprises a first and second MOS transistor means of the P conductivity types 32 and 34, respectively. The first and second inverter means 12 and 22 and the first and second MOS transistor means 32 and 34 are of the same elements as those described for the voltage level shifting circuit 10, shown in FIG. 1.

In the voltage level shifting circuit 110, as shown in FIG. 2, the first voltage port 16 of the first inverter means 12 is connected to the drain of the first transistor means 32. The second inverter means 22 is connected to the drain of the second transistor means 34 at the first voltage port 26 thereof. The source of the first and second transistor means 32 and 34 are connected to $V_{pp}$. The gate of the first transistor means 32 is connected to the output port 30 of the second inverter means 22. The gate of the second transistor means 34 is connected to the output port 20 of the first inverter means 12.

In the voltage level shifting circuit 110, the input port 24 of the second inverter means 22 is connected to a source for the second voltage; i.e., $V_{dd}$. Further, the second voltage port 28 of the second inverter means 22 is connected to the input port 14 of the first inverter means 12 and is adapted to receive the input signal. In all other respects, the first inverter means 12, the second inverter means 22, the first and second transistor means 32 and 34 are all connected in the same way as they are connected in the circuit 10, shown in FIG. 1.

In the operation of the voltage level shifting circuit 110, if the input signal I is zero volts, then the voltage level shifting circuit 110 would be connected no differently than the voltage level shifting circuit 10 is connected, as shown in FIG. 1.

If the input signal is at +5 volts, transistor N1 would be turned on. The output port 20 of the first inverter means 12 would reach ground potential. This would turn on MOS transistor 34. When the input signal I is at +5 volts, the source of transistor N2 would also be at +5 volts. The gate of the transistor N2, connected to $V_{dd}$, would also be at +5 volts. However, this would still leave transistor N2 turned off. Since transistor 34 is turned on, the source of transistor P2, i.e., the first voltage port 26, would be at $V_{pp}$. Since $V_{pp} > V_{dd}$, transistor P2 would also turn on. Transistor P2 being turned on would cause the voltage level at the output port 30 of the second inverter means to rise $V_{pp}$. This is the same condition as in the case for the voltage level shifting circuit 10.

Thus, operationally, the voltage level shifting circuit 110 operates functionally identical to the voltage level shifting circuit 10. However, unlike the voltage level shifting circuit 10, shown in FIG. 1 which requires the input signal and the inverse input signal, the voltage level shifting circuit 110 requires only that an input signal be supplied to it. In many instances, $V_{dd}$ maybe more readily available than an inverse input signal.

Figure 3:
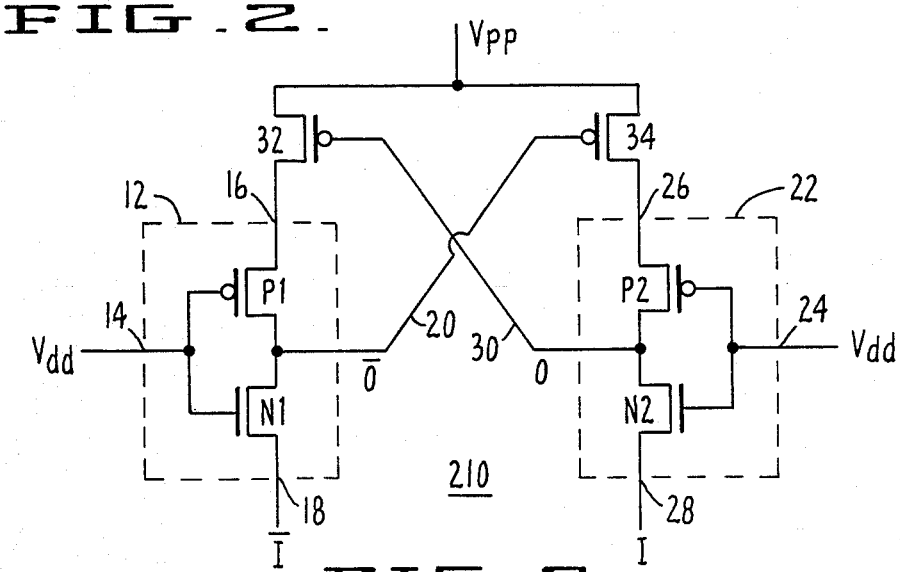
FIG. 3 is a schematic circuit diagram of yet another embodiment of a shift-up voltage level shifting circuit of the present invention.

Referring to FIG. 3, there is shown yet another embodiment of a shift-up voltage level shifting circuit 210 of the present invention. The voltage level shifting circuit 210 comprises a first inverter means 12 having a first voltage port 16, a second voltage port 18, an output port 20, and an input port 14. The voltage level shifting circuit 210 also comprises a second inverter means 22 having a first voltage port 26, a second voltage port 28, an output port 30 and an input port 24. The voltage level shifting circuit 210 also comprises a first and second MOS transistor means of the P conductivity types 32 and 34, respectively. The first and second inverter means 12 and 22 and the first and second MOS transistor means 32 and 34 are of the same elements as those described for the voltage level shifting circuit 10, shown FIG. 1.

In the voltage level shifting circuit 210, as shown in FIG. 3, the first voltage port 16 of the first inverter means 12 is connected to the drain of the first transistor means 32. The second inverter means 22 is connected to the drain of the second transistor means 34 at the first voltage port 26 thereof. The source of the first and second transistor means 32 and 34 are connected to $V_{pp}$. The gate of the first transistor means 32 is connected to the output port 30 of the second inverter means 22. The gate of the second transistor means 34 is connected to the output port 20 of the first inverter means 12.

In the voltage level shifting circuit 210, the input port 24 of the second inverter means 22 and the input port 14 of the first inverter means 12 are connected to a source for the second voltage; i.e., $V_{dd}$. Further, the second voltage port 28 of the second inverter means 22 is connected to receive the input signal. The second voltage port 18 of the first inverter means 12 is connected to receive an inverted input signal. In all other respects, the first inverter means 12, the second inverter means 22, the first and second transistor means 32 and 34 are all connected in the same way as they are connected in the circuit 10, shown in FIG. 1.

In the operation of the shift-up voltage level shifting circuit 210, if the input signal I is at zero volts, then transistor N2 would be on. This would bring the output port 30 of the second inverter means 22 to ground potential or zero volts. At the same time, since the inverted input signal $\bar{I}$ is at +5 volts, that signal would turn off transistor N1. This disconnects the inverse input signal $\bar{I}$ from the output port 20 of the first inverter means 12. Further, since $V_{pp}$ is greater than $V_{dd}$, and since the output port 20 of the first inverter means 12 is floating, transistors 32 and P1 are both on. This would bring the output port 20 of the first inverter means 12 to the voltage potential of $V_{pp}$. At that point, since the output port 20 is connected to the gate of transistor 34, transistor 34 would be turned off. The first voltage port 26 of the second inverter means 22 will then be pulled down to about +5 volts $+V_t$ (of P2). At that point, transistor P2 will be turned off.

In the shift-up voltage circuits 10 and 110 as shown in FIGS. 1 and 2, when the output port 20 of the first inverter means 12 is at $V_{pp}$, the voltage difference between the drain and the gate of transistor N1 would be $V_{pp}$ − zero volts or Vpp. This would have put a load of $V_{pp}$ across transistor N1. In contrast, in the shift-up voltage circuit 210 of FIG. 3, the voltage potential across the drain and gate of transistor N1 is $V_{pp} - V_{dd}$. This reduces the voltage across the gate and drain of transistor N1 such that the immunity of the circuit to breakdown is more than 5 volts beyond the gated-diode breakdown voltage of the N-type MOS transistor. Therefore, this circuit is protected from the breakdown of the N-type, as well as P-type, MOS transistors.

Figure 4:
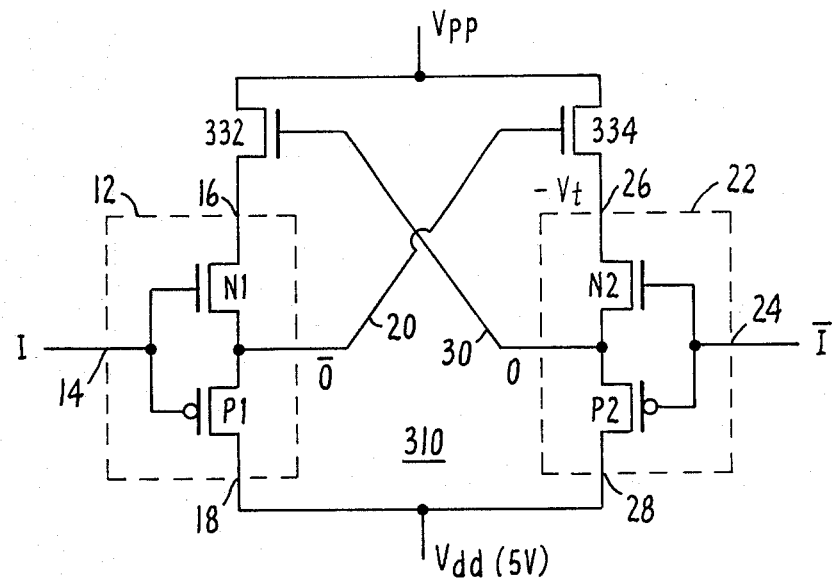
FIG. 4 is a schematic circuit diagram of one embodiment of a shift-down voltage level shifting circuit of the present invention.

Referring to FIG. 4, there is shown a schematic circuit diagram of a shifted-down voltage level shifting circuit 310 of the present invention. The circuit 310 is identical to the circuit 10 as shown in FIG. 1 except for the following: each of the P-type conductivity MOS transistors shown in FIG. 1 is replaced by an N-type MOS transistor in FIG. 4; each of the N-type MOS transistors shown in FIG. 1 is replaced by a P-type MOS transistor in FIG. 4; $V_{pp}$ of FIG. 1 which is at +20 volts is now typically at a high negative voltage such as −20 volts; finally, ground potential which is connected to the first voltage port 18 and 28 is replaced by $V_{dd}$, which is at +5 volts.

In the shift-down circuit 310 shown in FIG. 4, the input signal I, as before, varies between ground potential or zero volts and +5 volts. The output signal, however, would vary between −20 volts ($V_{pp}$) and +5 volts. This is typically termed a shift of logic "0" level; i.e., the second voltage of the input signal (0 volts) is shifted down to a third voltage (−20 volts).

The operation of the shift-down voltage level shifting circuit 310 is identical to that of the operation for the shift-up voltage level shifting circuit 10. If the input signal I is at +5 volts $\bar{I}$ will be at zero volts. Transistor P2 will be turned on. The output 30 of the second inverter means 22 would then be at $V_{dd}$ or +5 volts. Transistor P1 will be turned off. This prevents the output 20 of the first inverter means 12 from reaching +5 volts. With the gate of the transistor 332 and the gate of the transistor N1 both connected to $V_{dd}$, both of these transistors will be turned on which will bring the output 20 of the first inverter means 12 to the third voltage potential, $V_{pp}$.

When the output port 20 of the first inverter means 12 reaches $V_{pp}$, transistor 334 would then be turned off. This would disconnect the first voltage port 26 from $V_{pp}$. Prior to output port 20 reaching $V_{pp}$, transistor 334 is on, bringing the first voltage port 26 below $V_{dd}$. Transistor N2 is on only as long as the voltage $V_{gs}$ applied to it exceeds its threshold voltage $V_T$. $V_{gs}$ is the voltage differential between the voltage at the first voltage port 26 and the voltage at input port 24. Since $\bar{I}$ is at 0 volts, when the voltage at the first voltage port 26 reaches $V_T$, $V_{gs}$ would then equal $V_T$. When $V_{gs} < V_T$, transistor N2 would then be turned off.

When the input signal I is at zero volts, the analysis would proceed in the same manner as before since the circuit has left-right symmetry. The output signal taken from the output port 30 of the second inverter means 2 would then be at $V_{pp}$.

The limitation of the circuit 310 is that so long as $V_{pp}$ minus (second voltage of input signal + $V_T$ of transistor N1) < the gated − diode breakdown voltage (GDBV-N) for transistor N2, then the circuit 10 would function properly. I.E.

$$V_{pp} - (2\text{nd } V + V_T \text{ of N2}) < \text{GDBV-N}$$

In the case where the second voltage of the input signal is at 0 volts, and for a 1.5 to 2 micron process, GDBV-N is approximately −15 volts, $V_{pp}$ can be more than −20 volts. It can be seen that, by this limitation, the input signal does not have to vary between zero volts and +5 volts. The second voltage can be less than 0 volts so long as the second voltage is high enough to turn on transistor P2 to bring the output port 30 to +5 voltage and so long as the relationship between $V_{pp}$, second voltage, $V_T$ and GDBV-N is satisfied.

Figure 5:
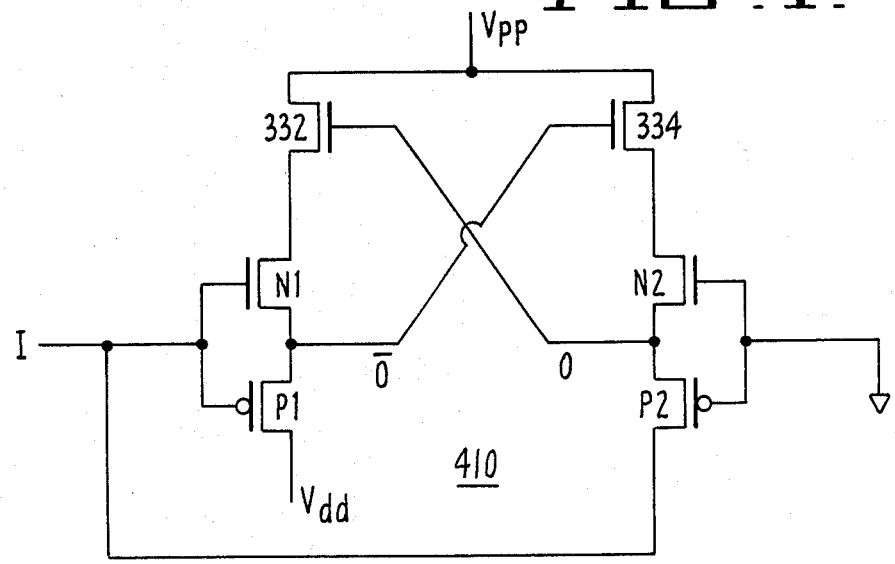
FIG. 5 is a schematic circuit diagram of another embodiment of a shift-down voltage level shifting circuit of the present invention.
Figure 6:
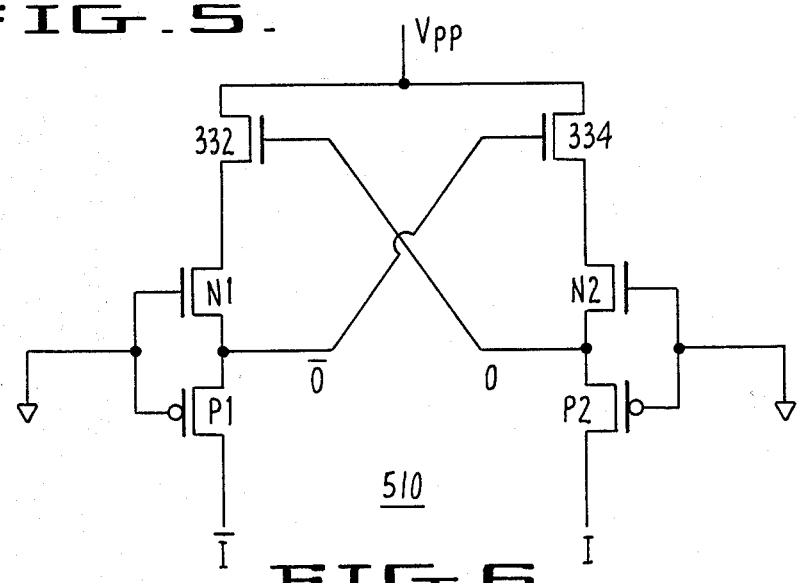
FIG. 6 is a schematic circuit diagram of yet another embodiment of a shift-down voltage level shifting circuit of the present invention.

Referring to FIG. 5, there is shown another embodiment of a shift-down voltage level shifting circuit 410 of the present invention. The shift-down voltage level shifting circuit 410 is entirely analogous to the shift-up voltage level shifting circuit 110 as shown in FIG. 2. The operation of the shift-down voltage level shifting circuit 410 is identical to the operation of the shift-down voltage level shifting circuit 310 shown in FIG. 4. Referring to FIG. 6, there is shown a shift-down voltage level shifting circuit 510 which is analogous to the shift-up voltage level shifting circuit 210 of FIG. 3. The operation of the shift-down voltage level shifting circuit 510 of FIG. 6 can be readily understood by referring to the operation for the shift-up circuit voltage level shifting circuit 210 and the shift-down voltage level shifting circuit 310.

There are many advantages to the voltage level shifting circuit of the present invention. First and foremost is that high voltage levels, such as plus or minus 20 volts, can be switched with input signals that are conventional, digital voltage levels (e.g., 0 to +5 volts or less). Further, high voltage switching is not limited by the gate-to-diode breakdown voltage of the MOS transistor of the P or N conductivity type. Finally, except for parasitics, no current flows under DC conditions.

What is claimed in:

1. A voltage level shifting circuit for receiving an input signal, varying between a first voltage, and second voltage and producing an output signal, varying between said first voltage and a third voltage, said circuit comprising:
    a first inverter means having an input port, an output port, a first voltage port and a second voltage port; said first inverter means having a plurality of MOS transistors with at least one transistor of a first conductivity type and at least one transistor of a second conductivity type; said one transistor of the first conductivity type having a source, a drain and a gate with said source connected to said first voltage port; said transistor of the second conductivity type having a source, a drain and a gate with the source connected to the second voltage port, and said gate of said transistor of the first conductivity type connected to said gate of said transistor of the second conductivity type;
    a first MOS transistor means of the first conductivity type having a source, a drain and a gate with said drain connected to said first voltage port of said first inverter means;
    a second inverter means having an input port, an output port, a first voltage port and a second voltage port, said second inverter means having a plurality of MOS transistors with at least one transistor of a first conductivity type and at least one transistor of a second conductivity type, said one transistor of the first conductivity type having a source, a drain and a gate with said source connected to said first voltage port; said transistor of the second conductivity type having a source, a drain and a gate with the source connected to the second voltage port, and said gate of said transistor of the first conductivity type connected to said gate of said transistor of the second conductivity type;
    a second MOS transistor means of the first conductivity type having a source, a drain and a gate with said drain connected to said first voltage port of said second inverter means;
    said source of said first and second MOS transistor means are connected together and to a voltage source for said third voltage;
    first coupling means for connecting the gate of said first MOS transistor means to said output port of said second inverter means;
    second coupling means for connecting the gate of said second MOS transistor means to said output port of said first inverter means; and
    said input signal is supplied to said input port of said first inverter means; an inverted input signal is supplied to said input port of said second inverter means; said second voltage port of said first and second inverter means are connected together to a voltage source for said first voltage; and said output port of said second inverter means provides said output a signal.

2. The circuit of claim 1 wherein said first conductivity type is P conductivity type.

3. The circuit of claim 2 wherein said third voltage is greater than said second voltage and wherein said first voltage is ground potential.

4. The circuit of claim 2 wherein said first inverter means includes an N type MOS transistor having a gate, a source and a drain;
    said gate of said N type and P type transistors are connected together and to said input port;
    said drain of said P type MOS transistor connected to the drain of said N type MOS transistor and to said output port; and
    said source of said N type MOS transistor is connected to said second voltage port.

5. The circuit of claim 2 wherein said second inverter means includes an N type MOS transistor having a gate, a source and a drain;
    said gate of said N type and P type transistors are connected together and to said input port;
    said drain of said P type MOS transistor is connected to the drain of said N type MOS transistor and to said output port; and
    said source of said N type MOS transistor is connected to said second voltage port.

6. The circuit of claim 1 wherein said first conductivity type is N conductivity type.

7. The circuit of claim 6 wherein said third voltage is less than said second voltage and wherein said first voltage is a positive voltage potential.

8. The circuit of claim 6 wherein said first inverter means includes a P type MOS transistor having a gate, a source and a drain;
    said gate of said N type and P type transistors are connected together and to said input port;
    said drain of said P type MOS transistor is connected to the drain of said N type MOS transistor and to said output port; and
    said source of said P type MOS transistor is connected to said second voltage port.

9. The circuit of claim 6 wherein said second inverter means includes a P type MOS transistor having a gate, a source and a drain;
    said gate of said N type and P type transistors are connected together and to said input port;
    said drain of said P type MOS transistor is connected to the drain of said N type MOS transistor and to said output port; and
    said source of said P type MOS transistor is connected to said second voltage port.

10. A voltage level shifting circuit for receiving an input signal, varying between a first voltage and a second voltage and producing an output signal, varying between said first voltage and a third voltage, said circuit comprising:
    a first inverter means having an input port, an output port, a first voltage port and a second voltage port; said first inverter means having a plurality of MOS transistors with at least one transistor of a first conductivity type and at least one transistor of a second conductivity type; said one transistor of the first conductivity type having a source, a drain and a gate with said source connected to said first voltage port; said transistor of the second conductivity type having a source, a drain and a gate with the source connected to the second voltage port, and said gate of said transistor of the first conductivity type connected to said gate of said transistor of the second conductivity type;
    a first MOS transistor means of the first conductivity type having a source, a drain and a gate with said drain connected to said first voltage port of said first inverter means;
    a second inverter means having an input port, an output port, a first voltage port and a second voltage port, said second inverter means having a plurality of MOS transistors with at least one transistor of a first conductivity type and at least one transistor of a second conductivity type; said one transistor of the first conductivity type having a source, a drain and a gate with said source connected to said first voltage port; said transistor of the second conductivity type having a source, a drain and a gate with the source connected to the second voltage port, and said gate of said transistor of the first conductivity type connected to said gate of said transistor of the second conductivity type;
    a second MOS transistor means of the first conductivity type having a source, a drain and a gate with said drain connected to said first voltage port of said second inverter means;
    said source of said first and second MOS transistor means are connected together and to a voltage source for said third voltage;
    first coupling means for connecting the gate of said first MOS transistor means to said output port of said second inverter means;
    second coupling means for connecting the gate of said second MOS transistor means to said output port of said first inverter means; and
    said input signal is supplied to said input port of said first inverter means and to said second voltage port of said second inverter means; said input port of said second inverter means is connected to a voltage source for said second voltage; said second voltage port of said first inverter means is connected to a voltage source for said first voltage; and said output port of said second inverter means provides said output signal.

11. The circuit of claim 10 wherein said first conductivity type is P conductivity type.

12. The circuit of claim 11 wherein said third voltage is greater than said second voltage and wherein said first voltage is ground potential.

13. The circuit of claim 11 wherein said first inverter means includes an N type MOS transistor having a gate, a source and a drain;
    said gate of said N type and P type transistors are connected together and to said input port;
    said drain of said P type MOS transistor connected to the drain of said N type MOS transistor and to said output port; and
    said source of said N type MOS transistor is connected to said second voltage port.

14. The circuit of claim 11 wherein said second inverter means includes an N type MOS transistor having a gate, a source and a drain;
    said gate of said N type and P type transistors are connected together and to said input port;
    said drain of said P type MOS transistor is connected to the drain of said N type MOS transistor and to said output port; and
    said source of said N type MOS transistor is connected to said second voltage port.

15. The circuit of claim 10 wherein said first conductivity type is N conductivity type.

16. The circuit of claim 15 wherein said third voltage is less than said second voltage and wherein said first voltage is a positive voltage potential.

17. The circuit of claim 15 wherein said first inverter means includes a P type MOS transistor having a gate, a source and a drain;
    said gate of said N type and P type transistors are connected together and to said input port;
    said drain of said P type MOS transistor is connected to the drain of said N type MOS transistor and to said output port; and
    said source of said P type MOS transistor is connected to said second voltage port.

18. The circuit of claim 15 wherein said second inverter means includes a P type MOS transistor having a gate, a source and a drain;
    said gate of said N type and P type transistors are connected together and to said input port;
    said drain of said P type MOS transistor is connected to the drain of said N type MOS transistor and to said output port; and
    said source of said P type MOS transistor is connected to said second voltage port.

19. A voltage level shifting circuit for receiving an input signal, varying between a first voltage and a second voltage and producing an output signal, varying between said first voltage and a third voltage, said circuit comprising:
    a first inverter means having an input port, an output port, a first voltage port and a second voltage port; said first inverter means having a plurality of MOS transistors with at least one transistor of a first conductivity type and at least one transistor of a second conductivity type; said one transistor of the first conductivity type having a source, a drain and a gate with said source connected to said first voltage port; said transistor of the second conductivity type having a source, a drain and a gate with the source connected to the second voltage port, and said gate of said transistor of the first conductivity type connected to said gate of said transistor of the second conductivity type;

a first MOS transistor means of the first conductivity type having a source, a drain and a gate with said drain connected to said first voltage port of said first inverter means;

a second inverter means having an input port, an output port, a first voltage port and a second voltage port, said second inverter means having a plurality of MOS transistors with at least one transistor of a first conductivity type and at least one transistor of a second conductivity type; said one transistor of the first conductivity type having a source, a drain and a gate with said source connected to said first voltage port; said transistor of the second conductivity type having a source, a drain and a gate with the source connected to the second voltage port, and said gate of said transistor of the first conductivity type connected to said gate of said transistor of the second conductivity type;

a second MOS transistor means of the first conductivity type having a source, a drain and a gate with said drain connected to said first voltage port of said inverter means;

said source of said first and second MOS transistor means are connected together and to a voltage source for said third voltage;

first coupling means for connecting the gate of said first MOS transistor means to said output port of said second inverter means;

second coupling means for connecting the gate of said second MOS transistor means to said output port of said first inverter means; and said input signal is supplied to said second voltage port of said second inverter means, an inverter input signal is supplied to said second voltage port of said first inverter means; said input ports of said first and second inverter means are connected together and to a voltage source for said second voltage; said output port of said second inverter means provides said output signal.

20. The circuit of claim 19 wherein said first conductivity type is P conductivity type.

21. The circuit of claim 20 wherein said third voltage is greater than said second voltage and wherein said first voltage is ground potential.

22. The circuit of claim 20 wherein said first inverter means includes an N type MOS transistor having a gate, a source and a drain;
- said gate of said N type and P type transistors are connected together and to said input port;
- said drain of said P type MOS transistor is connected to the drain of said N type MOS transistor and to said output port; and
- said source of said N type MOS transistor is connected to said second voltage port.

23. The circuit of claim 20 wherein said second inverter means includes an N type MOS transistor having a gate, a source and a drain;
- said gate of said N type and P type transistors are connected together and to said input port;
- said drain of said P type MOS transistor is connected to the drain of said N type MOS transistor and to said output port; and
- said source of said N type MOS transistor is connected to said second voltage port.

24. The circuit of claim 19 wherein said first conductivity type is N conductivity type.

25. The circuit of claim 24 wherein said third voltage is less than said second voltage and wherein said first voltage is a positive voltage potential.

26. The circuit of claim 24 wherein said first inverter means includes a P type MOS transistor having a gate, a source and a drain;
- said gate of said N type and P type transistors are connected together and to said input port;
- said drain of said P type MOS transistor is connected to the drain of said N type MOS transistor and to said output port; and
- said source of said P type MOS transistor is connected to said second voltage port.

27. The circuit of claim 24 wherein said second inverter means includes a P type MOS transistor having a gate, a source and a drain;
- said gate of said N type and P type transistor are connected together and to said input port;
- said drain of said P type MOS transistor is connected to the drain of said N type MOS transistor and to said output port; and
- said source of said P type MOS transistor is connected to said second voltage port

* * * * *